(12) United States Patent
Jackson et al.

(10) Patent No.: US 10,840,179 B2
(45) Date of Patent: Nov. 17, 2020

(54) ELECTRONIC DEVICES WITH BOND PADS FORMED ON A MOLYBDENUM LAYER

(71) Applicant: TEXAS INSTRUMENTS INCORPORATED, Dallas, TX (US)

(72) Inventors: Ricky Alan Jackson, Richardson, TX (US); Ting-Ta Yen, San Jose, CA (US); Brian E. Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/898,694

(22) Filed: Feb. 19, 2018

(65) Prior Publication Data
US 2019/0206785 A1 Jul. 4, 2019

Related U.S. Application Data

(60) Provisional application No. 62/612,289, filed on Dec. 29, 2017.

(51) Int. Cl.
| | | |
|---|---|---|
| *H01L 23/00* | (2006.01) | |
| *H01L 23/498* | (2006.01) | |
| *H01L 23/58* | (2006.01) | |
| *H01L 25/07* | (2006.01) | |
| *H01L 23/532* | (2006.01) | |

(52) U.S. Cl.
CPC .. *H01L 23/49866* (2013.01); *H01L 23/49838* (2013.01); *H01L 23/53238* (2013.01); *H01L 23/562* (2013.01); *H01L 23/585* (2013.01); *H01L 24/05* (2013.01); *H01L 24/11* (2013.01); *H01L 24/12* (2013.01); *H01L 24/48* (2013.01); *H01L 25/074* (2013.01); *H01L 24/45* (2013.01); *H01L 2224/04042* (2013.01); *H01L 2224/05548* (2013.01); *H01L 2224/05558* (2013.01); *H01L 2224/05569* (2013.01); *H01L 2224/05624* (2013.01); *H01L 2224/06051* (2013.01); *H01L 2224/45144* (2013.01); *H01L 2224/48463* (2013.01); *H01L 2924/3656* (2013.01)

(58) Field of Classification Search
CPC ......... H01L 23/49866; H01L 23/53238; H01L 23/585; H01L 23/562; H01L 23/49838; H01L 24/48; H01L 24/12; H01L 24/11; H01L 25/074; H03H 9/173; H03H 9/172; H03H 9/10; H03H 9/14541
See application file for complete search history.

(56) References Cited

U.S. PATENT DOCUMENTS

| | | | | |
|---|---|---|---|---|
| 5,821,627 A * | 10/1998 | Mori | ...................... | H05K 3/328 257/780 |
| 5,910,756 A * | 6/1999 | Ella | ...................... | H03H 9/0095 310/322 |
| 6,337,522 B1 * | 1/2002 | Kang | ...................... | H01L 24/83 257/673 |
| 6,604,431 B1 * | 8/2003 | Soga | .................... | G11B 5/4833 347/70 |

(Continued)

*Primary Examiner* — Hoa B Trinh
(74) *Attorney, Agent, or Firm* — Andrew R. Ralston; Charles A. Brill; Frank D. Cimino

(57) ABSTRACT

An electronic device comprises: a molybdenum layer; a bond pad formed on the molybdenum layer, the bond pad comprising aluminum; and a wire bonded to the bond pad, the wire comprising gold.

27 Claims, 2 Drawing Sheets

(56) References Cited

U.S. PATENT DOCUMENTS

| | | | |
|---|---|---|---|
| 8,076,780 B2* | 12/2011 | Saigoh | H01L 23/3157 257/760 |
| 8,822,251 B2* | 9/2014 | Yamaguchi | H01L 35/34 438/48 |
| 2005/0184627 A1* | 8/2005 | Sano | H01L 41/316 310/363 |
| 2019/0035735 A1* | 1/2019 | Fitzsimmons | H01L 21/02529 |

* cited by examiner

ELECTRONIC DEVICES WITH BOND PADS FORMED ON A MOLYBDENUM LAYER

CROSS-REFERENCE TO RELATED APPLICATIONS

The present application claims priority to U.S. Provisional Patent Application No. 62/612,289, which was filed Dec. 29, 2017, is titled "Electronic Devices With Bond Pads Formed On A Molybdenum Layer," and is hereby incorporated herein by reference in its entirety.

BACKGROUND

For many types of packaged integrated circuits, wires are bonded to bond pads on the integrated circuits so that electrical connections may be provided to other devices in a system. It is desirable for the bonds to have low resistance and high reliability.

SUMMARY

In accordance with a first set of embodiments, an electronic device comprises: a molybdenum (Mo) layer; a bond pad formed on the Mo layer, the bond pad comprising aluminum (Al); and a wire bonded to the bond pad, the wire comprising gold (Au).

In accordance with the first set of embodiments, in the electronic device, the bond pad is an alloy comprising Al and copper (Cu).

In accordance with the first set of embodiments, in the electronic device, the Mo layer extends beyond a perimeter of the bond pad.

In accordance with the first set of embodiments, in the electronic device, the Mo layer forms a barrier layer to the bond pad.

In accordance with the first set of embodiments, the electronic device further comprises: a first electrode electrically coupled to the Mo layer; and a piezoelectric layer stack.

In accordance with the first set of embodiments, in the electronic device, the first electrode comprises Mo.

In accordance with the first set of embodiments, the electronic device, further comprises a second electrode, wherein the piezoelectric layer stack is positioned between the first electrode and the second electrode.

In accordance with the first set of embodiments, in the electronic device, the second electrode comprises Mo.

In accordance with the first set of embodiments, the electronic device further comprises a silicon substrate.

In accordance with a second set of embodiments, a method to fabricate an electronic device, the method comprising: depositing a molybdenum (Mo) layer; forming a bond pad on the Mo layer, the bond pad comprising aluminum (Al); and bonding a wire to the bond pad, the wire comprising gold (Au).

In accordance with the second set of embodiments, in the method, the bond pad is an alloy comprising Al and copper (Cu).

In accordance with the second set of embodiments, the method further comprises forming a piezoelectric layer stack, wherein the Mo layer is deposited on the piezoelectric layer stack.

In accordance with the second set of embodiments, the method further comprises forming an electrode, wherein the piezoelectric layer stack is formed over the electrode.

In accordance with the second set of embodiments, in the method, the Mo layer is in electrical contact with the electrode.

In accordance with the second set of embodiments, in the method, the electrode comprises Mo.

In accordance with a third set of embodiments, a method comprises: forming an electrode; forming a piezoelectric layer stack over the electrode; patterning and etching an opening into the piezoelectric layer stack to expose a portion of the electrode; depositing a molybdenum (Mo) layer onto the exposed portion of the electrode and over a portion of the piezoelectric layer stack; and forming a bond pad on the Mo layer.

In accordance with the third set of embodiments, the method further comprises bonding a wire to the bond pad, the wire comprising gold (Au).

BRIEF DESCRIPTION OF THE DRAWINGS

For a detailed description of various examples, reference will now be made to the accompanying drawings in which.

DETAILED DESCRIPTION

In many applications, an integrated circuit (IC) includes active components such as transistors, passive components such as microwave filters or resonators, or a combination thereof. To provide electrical connection to other devices in an electronic system, wires are bonded to bond pads on the IC, where the wires are connected to leads in the package containing the IC. In many applications, the wires are gold wires, and the bond pads include aluminum. During the bonding process, as well as during other high temperature processes, some of the aluminum in a bond pad can diffuse into the gold wire bonded to the bond pad, forming an intermetallic of aluminum and gold at an interface between the bond pad and the gold wire. The intermetallic can form Kirkendall voids, leading to a poor interface between the gold wire and the bond pad, thereby resulting in high resistance.

In accordance with the disclosed embodiments, an electronic device includes a molybdenum (Mo) layer under a bond pad, with a gold (Au) wire bonded to the bond pad. The Mo layer acts as a barrier layer, thereby reducing the impact of Kirkendall voids. In some applications, an electronic device includes a bulk acoustic wave (BAW) device, where the Mo layer may also provide additional utility in the BAW device, such as for example, to serve as an electrode and for impedance matching.

Figure 1:
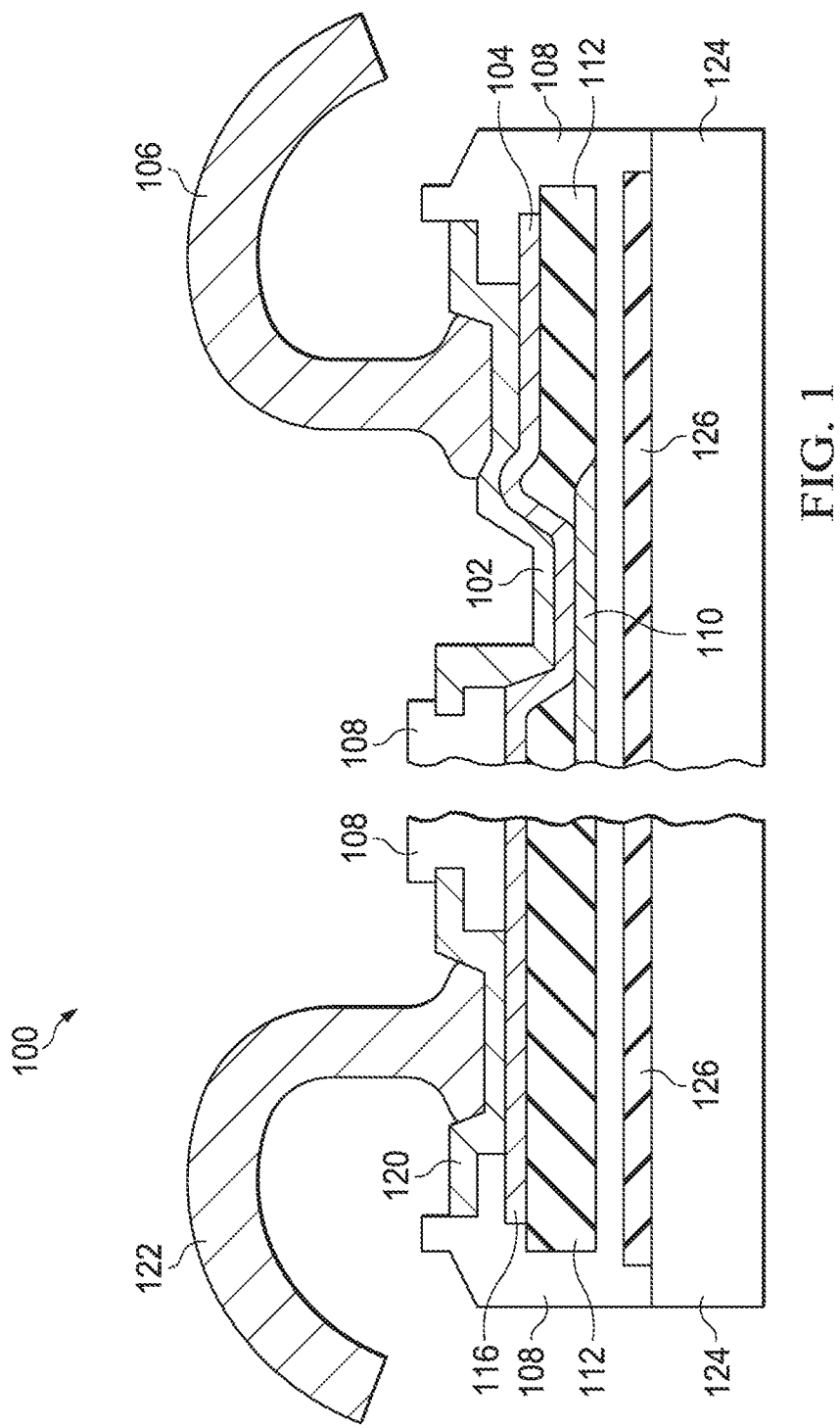
FIG. 1 shows an electronic device in accordance with various examples.

FIG. 1 shows an illustrative electronic device 100. The illustrative electronic device 100 includes components applicable to some types of bulk acoustic wave (BAW) devices, although embodiments are not limited to BAW devices.

A bond pad 102 is formed on a Mo layer 104. The bond pad 102 comprises aluminum (Al). In some embodiments, the bond pad 102 is an alloy comprising Al and copper (Cu). A wire 106 is bonded to the bond pad 102. In some embodiments, the wire 106 comprises Au. The Mo layer 104 is electrically coupled to a first electrode 110. In some embodiments, the first electrode 110 comprises Mo.

A bond pad 120 is formed to electrically couple to a second electrode 116. In some embodiments, the second electrode 116 comprises Mo, and can also be referred to as a Mo layer 116. The bond pad 120 comprises Al. In some embodiments, the bond pad 120 is an alloy comprising Al and Cu. A wire 122 is bonded to the bond pad 120. In some embodiments, the wire 122 comprises Au.

A piezoelectric layer stack 112 is positioned between the first electrode 110 and the second electrode 116. A piezoelectric layer stack 112 comprises a piezoelectric material, and in some embodiments the piezoelectric layer stack 112 comprises other types of layers, such as for example insulating layers.

The illustrative electronic device 100 includes additional layers, labeled in FIG. 1 as a layer stack 108. The layer stack 108 may comprise one or more conductive layers, and may comprise one or more insulating layers, with one or more layers serving as protective layers. The steps in a process flow for forming the layer stack 108 may include multiple steps performed at different times in the process flow, where in some embodiments not all of these steps are performed successively.

Because FIG. 1 shows two cut-away portions of the illustrative electronic device 100, the piezoelectric layer stack 112 is shown as three non-contiguous parts, and the layer stack 108 is illustrated as four non-contiguous parts. However, in some embodiments, the piezoelectric layer stack 112 and the layer stack 108 are each a contiguous stack, but are shown as non-contiguous because of various openings made for metallization and bonding of the wires 106 and 122. For example, the layer stack 108 has at least two openings formed therein: a first opening so that the bond pad 102 can be formed by deposition of metal, and the wire 106 can be bonded to the bond pad 102; and a second opening so that the bond pad 120 can be formed by deposition of metal, and the wire 122 can be bonded to the bond pad 120. As another example, an opening is made into the piezoelectric layer stack 112 for deposition of the Mo layer 104 so that the Mo layer 104 is electrically coupled to the first electrode 110.

The Mo layer 104 forms a barrier layer to the bond pad 102, and the Mo in the second electrode 116 (or alternatively stated, the Mo layer 116) forms a barrier layer to the bond pad 120. The barrier layers provided by the Mo allow for conduction paths during bonding without forming an intermetallic with the Au in the wires 106 and 122 at temperatures used in typical package processing, or when additional thermal processes in a process flow are applied to the illustrative electronic device 100.

The combination of the first electrode 110, the second electrode 116, and the piezoelectric layer stack 112 can be part of a BAW device, with the wires 106 and 122 providing electrical connection of the BAW device to other components of a system. In some embodiments, the process to form the first electrode 110, the second electrode 116, the piezoelectric layer stack 112, the Mo layer 104, the bond pads 102 and 120, the layer stack 108, and the wires 106 and 122, is compatible with a complementary metal oxide semiconductor (CMOS) process flow.

In the illustrative electronic device 100, the layer stack 108 is formed on and over a substrate 124. In some embodiments, the substrate 124 is a silicon substrate, where a silicon dioxide layer 126 is grown in and on the substrate 124, and the layer stack 108 is formed over the silicon dioxide layer 126. In some embodiments, the silicon dioxide layer 126 can be viewed as being part of the layer stack 108.

Embodiments need not include BAW devices, and may include other types of devices and ICs. In some embodiments, the illustrative electronic device 100 includes a BAW device integrated with other devices formed on the substrate 124. In a BAW device, the first electrode 110 is often referred to as the bottom electrode, and the second electrode 116 is often referred to as the top electrode.

Figure 2:
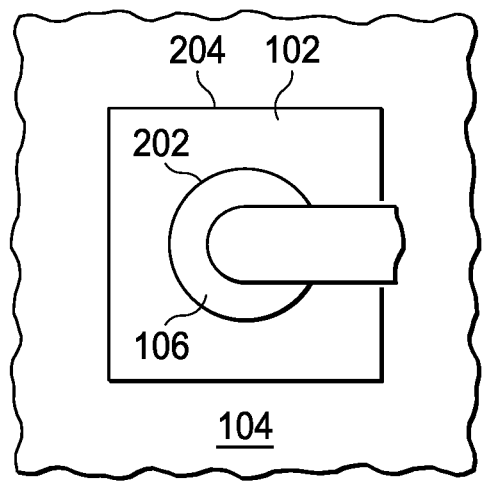
FIG. 2 shows a footprint of a wire in accordance with various examples.

FIG. 2 shows a simplified plan view of a footprint 202 of the wire 106. A perimeter 204 of the bond pad 102 is illustrated. In the particular embodiment of FIG. 2, the Mo layer 104 extends beyond the footprint 202, and the Mo layer 104 extends beyond the perimeter 204 of the bond pad 102. In some embodiments, the Mo layer 104 need not extend beyond the perimeter 204. With the Mo layer 104 extending beyond the perimeter 204, embodiments can include the Mo layer 104 as part of metal routing in the illustrative electronic device 100.

Figure 3:
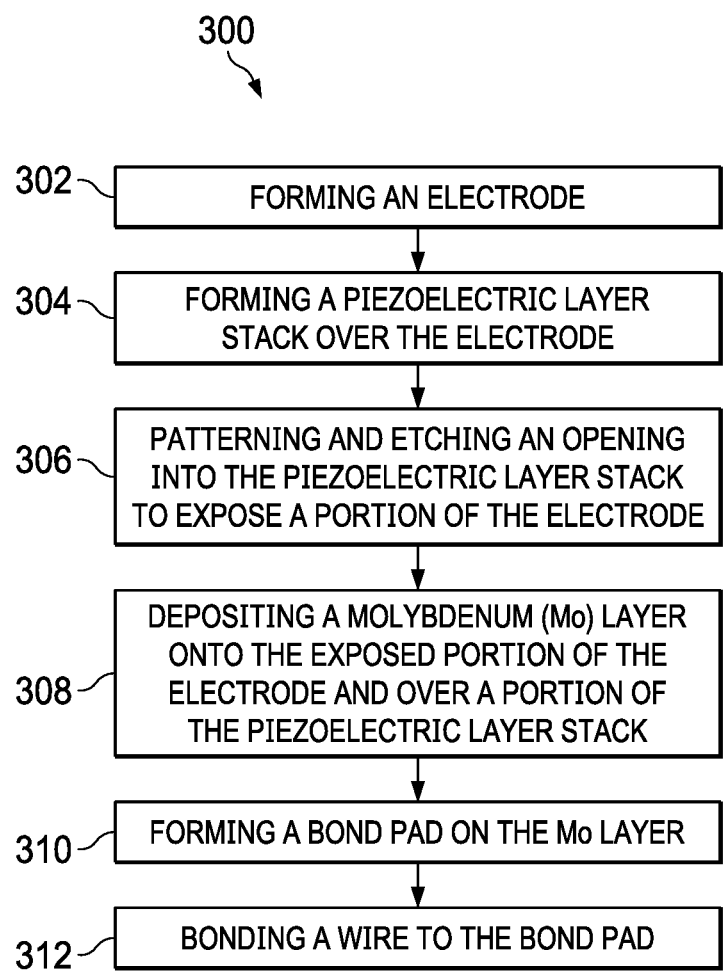
FIG. 3 shows a method in accordance with various examples.

FIG. 3 shows an illustrative method 300 to fabricate an illustrative electronic device 100 according to the some or all of the disclosed embodiments. Step 302 comprises forming an electrode (e.g., the first electrode 110, which may comprise Mo). Step 304 comprises forming a piezoelectric layer stack over the electrode. Step 306 comprises patterning and etching an opening into the piezoelectric layer stack to expose a portion of the electrode (e.g., the portion of the first electrode 100 that will make electrical contact with the Mo layer 104 as shown in FIG. 1). Step 308 comprises depositing a Mo layer (e.g., the Mo layer 104) onto the exposed portion of the first electrode and over a portion of the piezoelectric layer stack. In this way, the deposited Mo layer makes electrical connection to the electrode formed in step 302. Step 310 comprises forming a bond pad (e.g., the bond pad 102) on the Mo layer. The bond pad may comprise Al, and may be an alloy comprising Al and Cu. Step 312 comprises bonding a wire (e.g., the wire 106) to the bond pad. The wire may comprise Au.

FIG. 3 does not show all steps in a method to fabricate the illustrative electronic device 100. As an example, as described previously, multiple openings are formed by patterning and etching, where the multiple openings provide for electrical coupling to the electrodes, and bonding of the wires to their respective bond pads. In FIG. 3, the ordering of steps as listed does not imply any particular chronological ordering of the steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electronic device comprising:
   a molybdenum (Mo) layer conductively coupled to a first electrode;
   a second electrode conductively isolated from the first electrode;
   a piezoelectric layer stack located between the Mo layer and the first electrode, the Mo layer contacting the first electrode though an opening in the piezoelectric layer stack;
   a bond pad formed on the Mo layer, the bond pad comprising aluminum (Al); and
   a wire bonded to the bond pad, the wire comprising gold (Au).

2. The electronic device of claim 1, wherein the bond pad comprises an alloy comprising Al and copper (Cu).

3. The electronic device of claim 1, wherein the Mo layer extends beyond a perimeter of the bond pad.

4. The electronic device of claim 1, wherein the Mo layer forms a barrier layer between the bond pad and the piezoelectric stack.

5. The electronic device of claim 1, wherein the second electrode comprises Mo.

6. The electronic device of claim 1, further comprising a silicon substrate over which the first electrode is formed.

7. The electronic device of claim 1, wherein the first electrode comprises Mo.

8. The electronic device of claim 1, wherein the first and second electrodes and the piezoelectric layer implement a bulk acoustic wave (BAW) resonator.

9. A method to fabricate an electronic device, the method comprising:
    forming an electrode over a substrate, and forming a piezoelectric layer stack over the electrode;
    depositing a metal layer comprising molybdenum (Mo) over the piezoelectric layer stack, the metal layer including a first portion that touches the electrode through an opening in the piezoelectric layer stack and a second portion conductively isolated from the first portion; and
    forming a bond pad comprising aluminum (Al) over the electrode.

10. The method of claim 9, wherein the bond pad further comprises copper (Cu).

11. The method of claim 9, wherein the electrode comprises Mo.

12. The method of claim 9, further comprising bonding a gold wire to the bond pad.

13. The method of claim 9, wherein the electrode is a first electrode, and the metal layer has a first portion and a second portion conductively disconnected from the first portion, the first portion touching the first electrode and the second portion forming a second electrode over the piezoelectric layer stack.

14. The method of claim 13, wherein the first and second electrodes and the piezoelectric layer implement a bulk acoustic wave (BAW) resonator.

15. A method to fabricate an electronic device, the method comprising:
    forming an electrode;
    forming a piezoelectric layer stack over the electrode;
    patterning and etching an opening into the piezoelectric layer stack to expose a portion of the electrode;
    depositing a molybdenum (Mo) layer onto the exposed portion of the electrode and over a portion of the piezoelectric layer stack; and
    forming a bond pad on the Mo layer.

16. The method of claim 15, further comprising:
    bonding a wire to the bond pad, the wire comprising gold (Au).

17. The method of claim 15, wherein the electrode, Mo layer, and the piezoelectric layer implement a bulk acoustic wave (BAW) resonator.

18. The method of claim 15, wherein the bond pad comprises aluminum.

19. An electronic device, comprising:
    a piezoelectric layer located over a first electrode formed over a substrate;
    a second electrode located over the piezoelectric layer and conductively isolated from the first electrode;
    a bond pad located over the substrate; and
    a molybdenum (Mo) layer that contacts the first electrode through an opening in the piezoelectric layer, the Mo layer located between the bond pad and the first electrode.

20. The electronic device of claim 19, wherein the bond pad comprises aluminum.

21. The electronic device of claim 19, wherein the bond pad is a first bond pad, and further comprising a second bond pad electrically contacting the second electrode, wherein the second electrode comprises Mo.

22. The electronic device of claim 21, wherein the second bond pad comprises aluminum.

23. The electronic device of claim 19, wherein the first and second electrodes and the piezoelectric layer implement a bulk acoustic wave (BAW) resonator.

24. An electronic device comprising:
    a first metal layer comprising molybdenum (Mo) located at a first level over a substrate;
    a second metal layer comprising Mo located at a second level over the substrate and touching the first metal layer;
    a piezoelectric layer located between the first and second metal layers; and
    a third metal layer comprising Mo located at the second level over the substrate, the third metal layer conductively isolated from the second metal layer.

25. The electronic device of claim 24, further comprising a fourth metal layer comprising aluminum (Al) touching the second metal layer, and a fifth metal layer comprising Al touching the third metal layer.

26. The electronic device of claim 25, further comprising a first bond wire comprising gold (Au) bonded to the fourth metal layer and a second bond wire comprising Au bonded to the fifth metal layer.

27. The electronic device of claim 25, wherein the fourth and fifth metal layers are at a same height over the substrate.

* * * * *